US006646445B2

(12) United States Patent
Jimbo

(10) Patent No.: US 6,646,445 B2
(45) Date of Patent: Nov. 11, 2003

(54) THERMAL HEAD DETERMINING APPARATUS AND DETERMINING METHOD

(75) Inventor: Seiichi Jimbo, Chiba (JP)

(73) Assignee: Seiko Instruments Inc., Chiba (JP)

( * ) Notice: Subject to any disclaimer, the term of this patent is extended or adjusted under 35 U.S.C. 154(b) by 4 days.

(21) Appl. No.: 10/001,331

(22) Filed: Oct. 26, 2001

(65) Prior Publication Data

US 2002/0089323 A1 Jul. 11, 2002

(30) Foreign Application Priority Data

Nov. 7, 2000 (JP) ....................................... 2000-339510

(51) Int. Cl.[7] ................................................ G01R 27/08
(52) U.S. Cl. ........................ 324/525; 324/691; 324/713
(58) Field of Search ................................. 347/189, 190, 347/191; 400/120.12; 324/525, 654, 658, 678, 691, 703, 105, 713, 522

(56) References Cited

U.S. PATENT DOCUMENTS 5,852,369 A * 12/1998 Katsuma ..................... 324/678

* cited by examiner

*Primary Examiner*—Jay Patidar
*Assistant Examiner*—Vincent Q. Nguyen
(74) *Attorney, Agent, or Firm*—Adams & Wilks

(57) ABSTRACT

A thermal head model type determining apparatus for a thermal printer having a print engine containing a replaceable thermal head and a printer controller for controlling the print engine. The thermal head model type determining apparatus includes a memory for storing model type information tables containing property data for each of a plurality of different thermal head model types, a measuring circuit for measuring properties of a thermal head provided in the print engine, a and thermal head model type identifying device for determining the model type of the thermal head provided in the print engine by comparing the properties measured by the measuring circuit with the model type information tables stored in the memory.

18 Claims, 5 Drawing Sheets

THERMAL HEAD DETERMINING APPARATUS AND DETERMINING METHOD

BACKGROUND OF THE INVENTION

1. Field of the Invention

The present invention relates to an apparatus and a method for determining a property of a thermal head including a plurality of heating devices.

2. Description of the Related Art

A thermal line printer (hereinafter referred to as a "thermal printer") that is conventionally known uses, for example, a thermal head having a plurality of heating resistors linearly arranged to thermally record pictures, characters and the like on thermal paper of predetermined size. The thermal printer is composed of such main components as a printer engine PE including a thermal head and a paper feeder and a printer controller PC2 for controlling a printing process.

As shown in FIG. 4, for example, the printer engine PE is comprised of a thermal head 1, a motor 2 of a paper feed mechanism, and a sensor 3 for detecting the position of the thermal head. There are various model types of printer engines PE, and respective model types (or models) have different properties such as the rated voltage of the thermal head, the resistance of each heating resistor, the number of dots, and the number of driver ICs (that is, the number of blocks) for controlling current-carrying through the heating resistor or the like. Accordingly, the printer controller for controlling each of the different printer engines is provided with a control table which stores control information used for controlling each model optimally. Based on the control information depending on the printer engine to be controlled, the printer controller performs the control, thereby being capable of making the printer controller be commonly used.

The printer controller PC2 is provided with a CPU 10 for controlling the entire printer engine PE, a RAM 11 for storing various control constants, a ROM 12 for storing the control tables dedicated to each of the various models of printer engines PE, and a model setting switch 13 typically composed of a DIP switch and the like for setting a specific model of printer engine PE. By selecting the setting of the model setting switch 13, the printer controller PC2 can be adapted to a plurality of models of printer engines.

Furthermore, the printer controller PC2 includes a voltage measuring circuit 14 for carrying out a measurement of a power supply voltage which is supplied to the printer controller PC2 and the printer engine PE by an external power supply device 20, and a head configuration measuring circuit 15 for carrying out a measurement of the configuration of the thermal head 1 of the printer engine PE. The head configuration measuring circuit 15 measures specifically the resistance of each heating resistor, the number of dots, the number of blocks or the like of the thermal head 1.

Note that, the printer engine PE is detachably connected with the printer controller PC2 via a predetermined connector.

Incidentally, when the conventional printer controller PC2 is connected to the printer engine PE, the above-described model setting switch 13 has to be manually operated to make the setting suitable for the printer engine PE to be connected. Therefore, there is a problem that it is inconvenient in an assembly process in a plant or in a user's replacement of the thermal head.

Furthermore, there is another problem that the inaccurate setting of the model setting switch 13 induces a breakage of the printer engine PE or a mis-action (error) of the printer engine PE, resulting in a failure in normal printing. In particular, when the printer controller PC2 performs an initial diagnostic process of the thermal head immediately after power-up, in the case where the model setting switch 13 is not set normally, the printer engine PE includes a fear that some errors occur to result in a failure of printing. The reason will be described below.

In the procedure shown in the flowchart of FIG. 5, the conventional printer controller PC2 performs an initial diagnostic process. First, the printer controller PC2 reads the setting of model setting switch 13 on power-up at step S100 and the process advances to step S101. The printer controller PC2 reads the control table for the set model from the ROM 12 at step S101, and it stores the control table into the RAM 11 as a memory for control at step S102, and thereafter the process advances to step S103. In the case where the model setting switch 13 is not accurately set, the printer controller PC2 reads a control table which does not match the thermal head connected at step S101, and it stores an inaccurate control table into the RAM 11 at step S102.

The voltage measuring circuit 14 carries out a measurement of the voltage applied to the printer engine PE at step S103, and thereafter the process advances to step S104. At step S104, the printer controller PC2 compares the difference between the measured voltage and the content of setting in the model setting switch 13. When the voltage matches the content of setting, the process advances to step S106, and when the voltage does not match the content of setting, the printer controller PC2 performs an error process to display an error, output a notifying beep and the like at step S105.

However, as described above, in the case where the model setting switch 13 is inaccurately set, there arises a difference between the content of setting itself in the model setting switch 13 to be compared with the measured voltage and the property of the printer engine PE connected. Accordingly, the printer controller PC2 has a problem in that it is impossible to perform an accurate determination at step S104. That is, the printer controller PC2 includes such troubles that it performs the error process even in a state where the voltage primarily matches the setting, or in contrast, it keeps performing the process in spite of a state where the voltage does not match the setting.

Further, the head configuration measuring circuit 15 carries out a measurement of the configuration of the thermal head 1 (the number of dots or the number of blocks) at step S106, and the process advances to step S107. At step S107, the printer controller PC2 compares the difference between the measured configuration of the thermal head and the content of setting in the model setting switch 13. When the voltage does not match the content of setting, the printer controller PC2 performs an error process at step S108, and when it is determined that the voltage matches the content of setting, it completes the processing. However, as in the case of the previous step S104, when the model setting switch 13 is inaccurately set, similarly the printer controller PC2 has a problem in that it is impossible to perform an accurate determination at this step S107.

Therefore, when the model setting switch 13 is inaccurately set, the printer controller PC2 has a probability in that it cannot accurately perform the initial diagnostic process of the thermal head. In the worst case, there are such probabilities in that the printer engine is not entirely actuated due to the applied voltage which does not match the specification of the printer engine PE, or in that the printer engine inaccurately works because of the setting of the control table for the other models.

A DIP switch or the like composing the model setting switch 13 has a problem in the structure where the above-described mis-setting easily occurs. Furthermore, from the viewpoint of a reduction in the cost of the thermal printer, there is a request for reducing the number of components as many as possible by removing the model setting switch itself if possible.

SUMMARY OF THE INVENTION

The present invention has been devised for solving the above-described problems. An object of the present invention is to provide a determining apparatus and determining method for determining the model type of a thermal head in a thermal printer capable of automatically performing a determination of a thermal head model type without a model type setting switch.

The thermal head determining apparatus in accordance with the present invention, for achieving the above-described object, is a determining apparatus (printer controller PC) for determining the model type of a thermal head (1) from a plurality of different model types, each thermal head model type including a plurality of heating devices (heating resistor 1*a*), wherein the determining apparatus comprises a thermal head property storing device (ROM 33) for previously storing property data of the plurality of various models of thermal heads, thermal head property measuring devices (voltage measuring circuit 34, head configuration measuring circuit 35) for measuring properties of a thermal head connected to the determining apparatus, and thermal head model type determining devices (CPU 30 and a program for head initial diagnostic process) for determining the thermal head model type connected to the determining apparatus by comparing/checking the property measured by the thermal head property measuring devices with the data stored in the thermal head property storing device.

Therefore, by simply connecting the thermal head (printer engine) with the printer controller PC, the printer controller PC can automatically determine the correct model of thermal head. Since the printer controller PC can specify a control table suitable for the thermal head based on the result of the determination, for example, it can prevent such a situation where a breakage or a mis-action of the thermal head occurs due to the mis-setting of the thermal head model.

Furthermore, since the printer controller PC does not need to have a model setting switch, it can prevent the occurrence of human error in setting the model type and it can reduce the number of components of the printer, resulting in a reduction in the cost of the thermal printer.

The property data of the thermal head includes: the rated voltage; the resistance of each heating device; and the number of dots.

Further, the thermal head property measuring devices can be composed of an applied voltage measuring device for measuring the voltage applied to the thermal head to be connected. Accordingly, when comparing/checking the measured voltage with the rated voltage relating to the property data of the thermal head, the printer controller PC can determine the model of the thermal head.

Furthermore, the thermal head property measuring devices can be composed of a thermal head configuration measuring device for measuring the resistance of each heating device and the number of dots in the thermal head to be connected. Accordingly, when comparing/checking the measured resistance of each of the heating device or the measured number of dots in the thermal head with the property data of the thermal head, the printer controller PC can more accurately determine the model of the thermal head.

Further, the thermal head property storing device and the thermal head property measuring devices may be included in a controller for controlling the thermal head. Accordingly, in the initial diagnostic process of the thermal head which is performed in the controller immediately after power-up, the printer controller PC can determine the model of the thermal head and also set the appropriate control table based on the result of the determination.

Furthermore, another aspect of the invention is a determining method for determining the property of the thermal head including a plurality of heating devices, wherein the determining method comprises the steps of storing previously the property data of the plurality of various models of thermal heads, measuring the properties of thermal head at the time of conenction of the thermal head to the printer controller PC, comparing/checking the result of the measurement with the property data of the thermal heads, and determining the model of the connected thermal head. Accordingly, by simply connecting the thermal head with the printer controller PC, the printer controller PC can determine automatically the correct model of the thermal head. Since the printer controller PC can specify the control table suitable for the thermal head based on the result of the determination, it can prevent the situation where a breakage or a mis-action of the thermal head occurs due to the mis-setting of the thermal head model.

DESCRIPTION OF THE PREFERRED EMBODIMENTS

Figure 2:
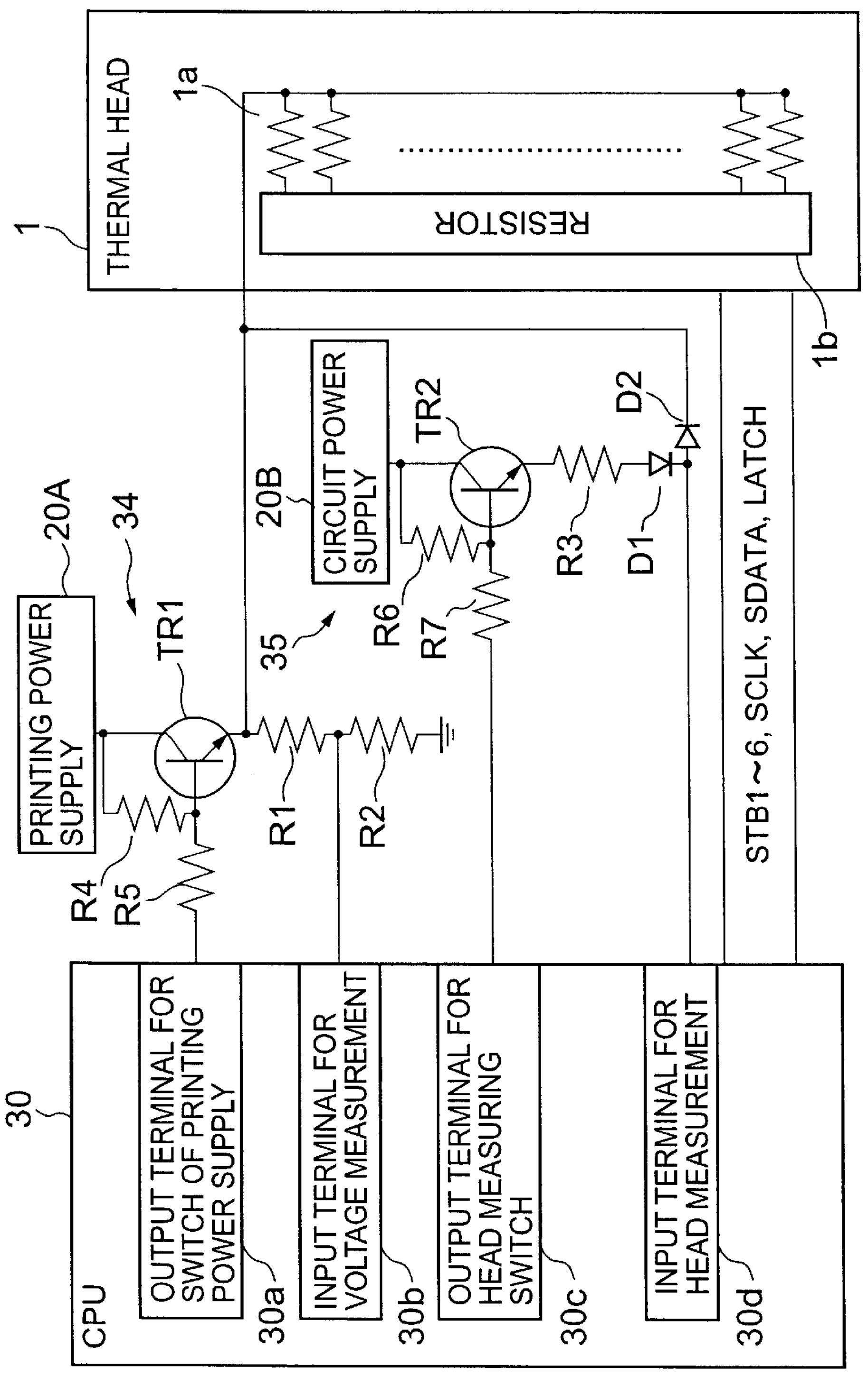
FIG. 2 is a circuit diagram showing the constitution example of a voltage measuring circuit and a head configuration measuring circuit of the printer controller according to the present embodiment.
Figure 3:
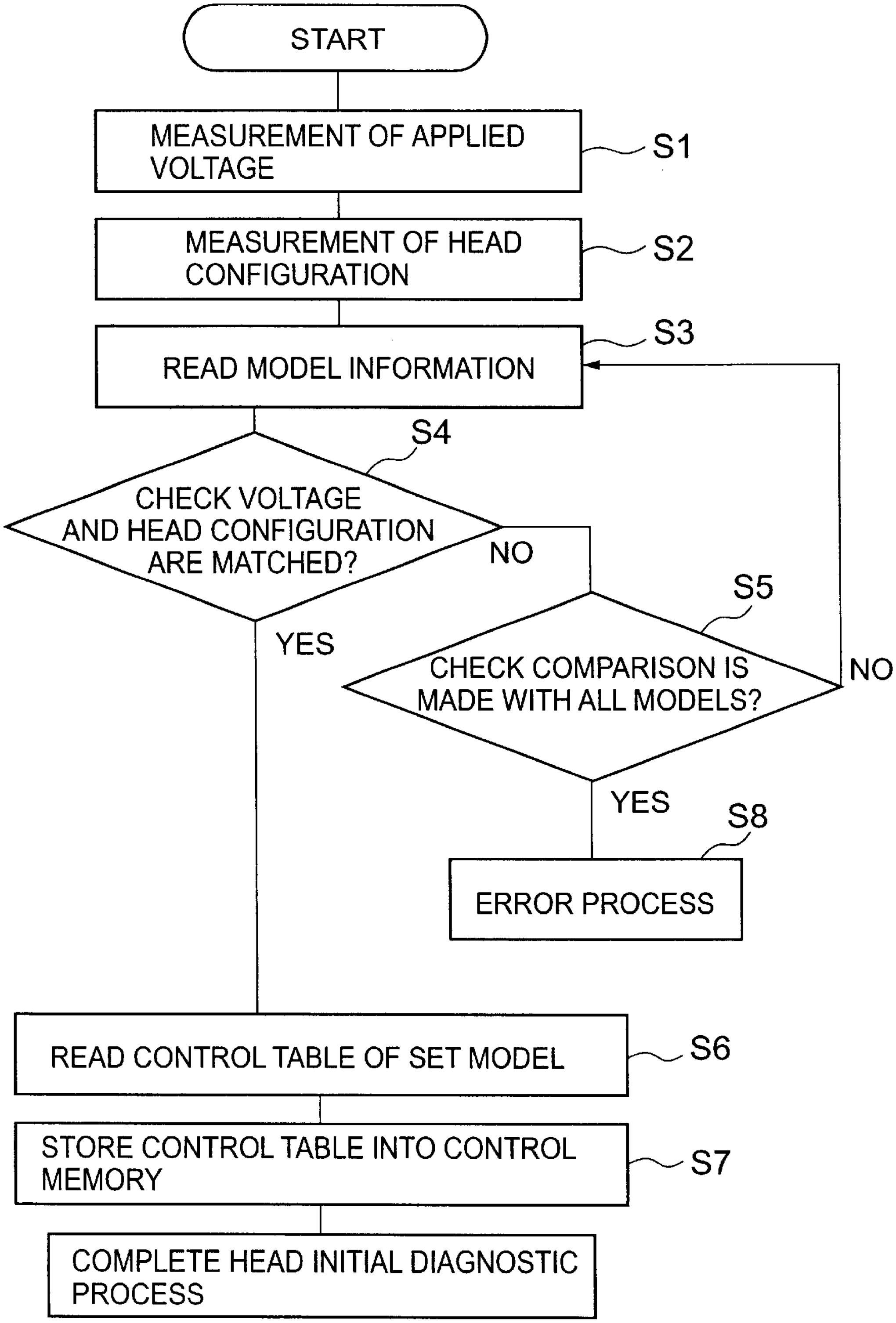
FIG. 3 is a flow chart showing a processing flow of a head initial diagnostic process performed by the printer controller according to the present embodiment.
Figure 4:
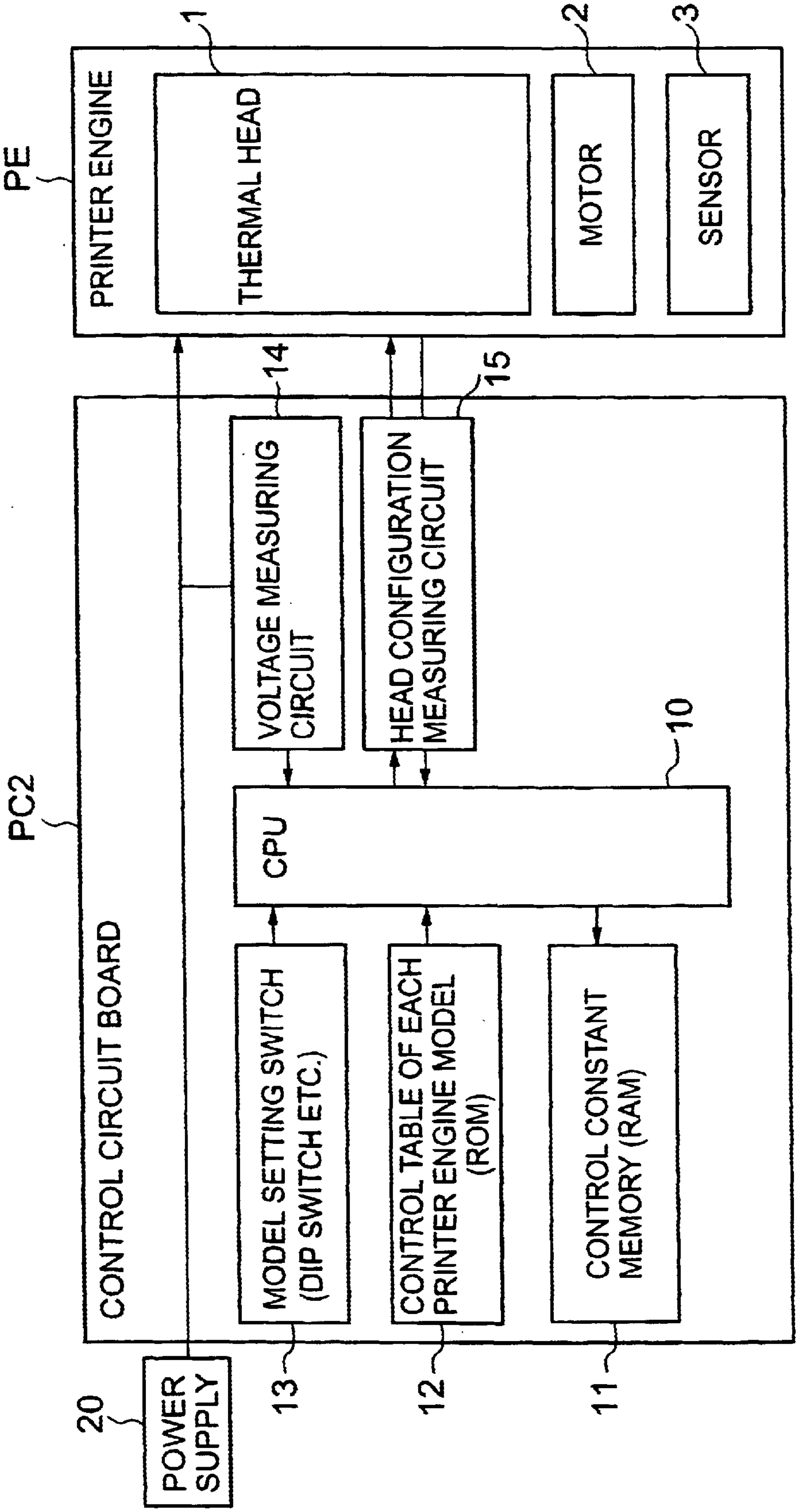
FIG.4 PRIOR ART
FIG. 4 is a block diagram showing the schematic configuration of a conventional printer controller and printer engine.
Figure 5:
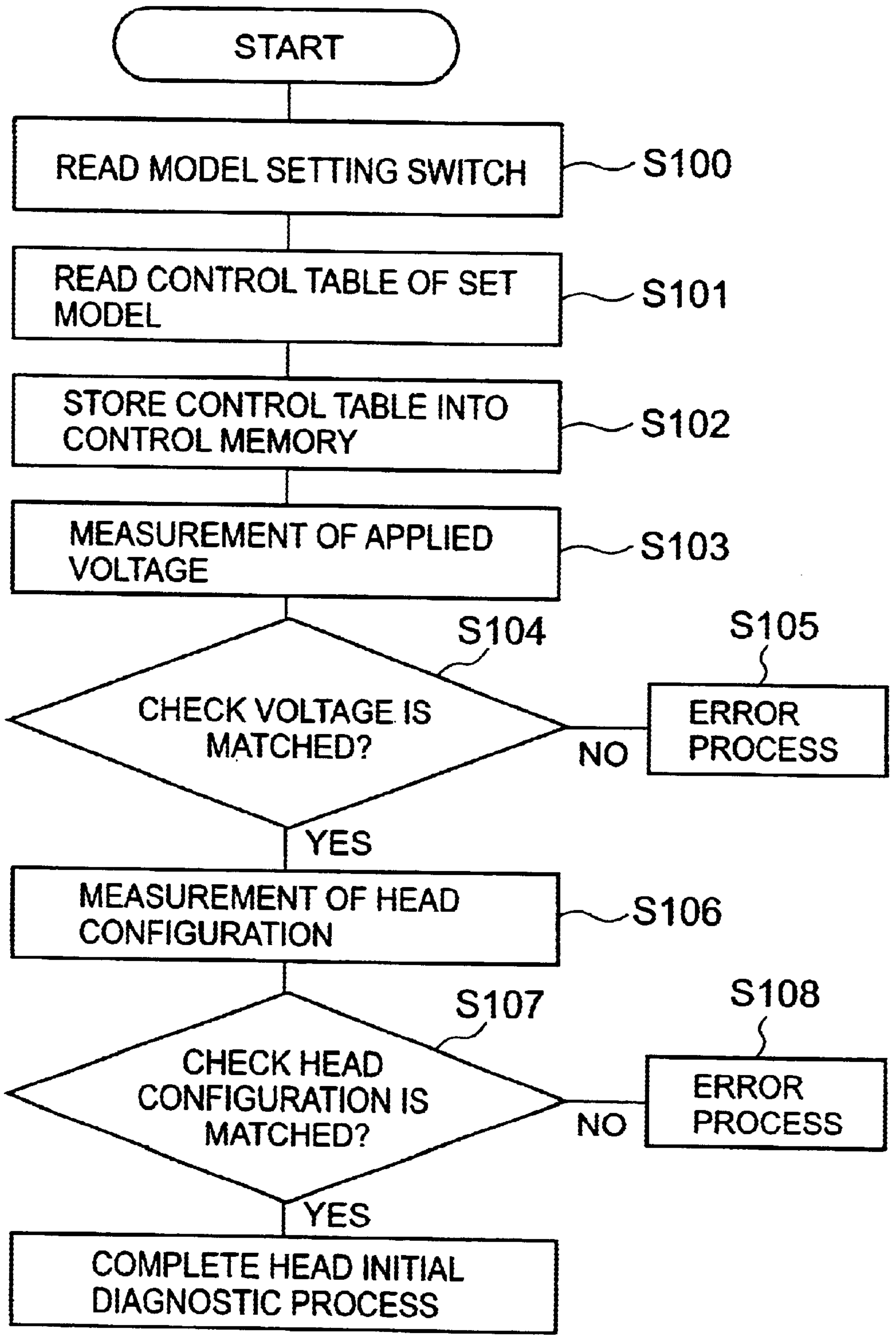
FIG.5 PRIOR ART
FIG. 5 is a flow chart showing a processing flow of a head initial diagnostic process performed by the conventional printer controller.

A preferred embodiment of the present invention will be described below with reference to FIGS. 1 to 3.

Figure 1:
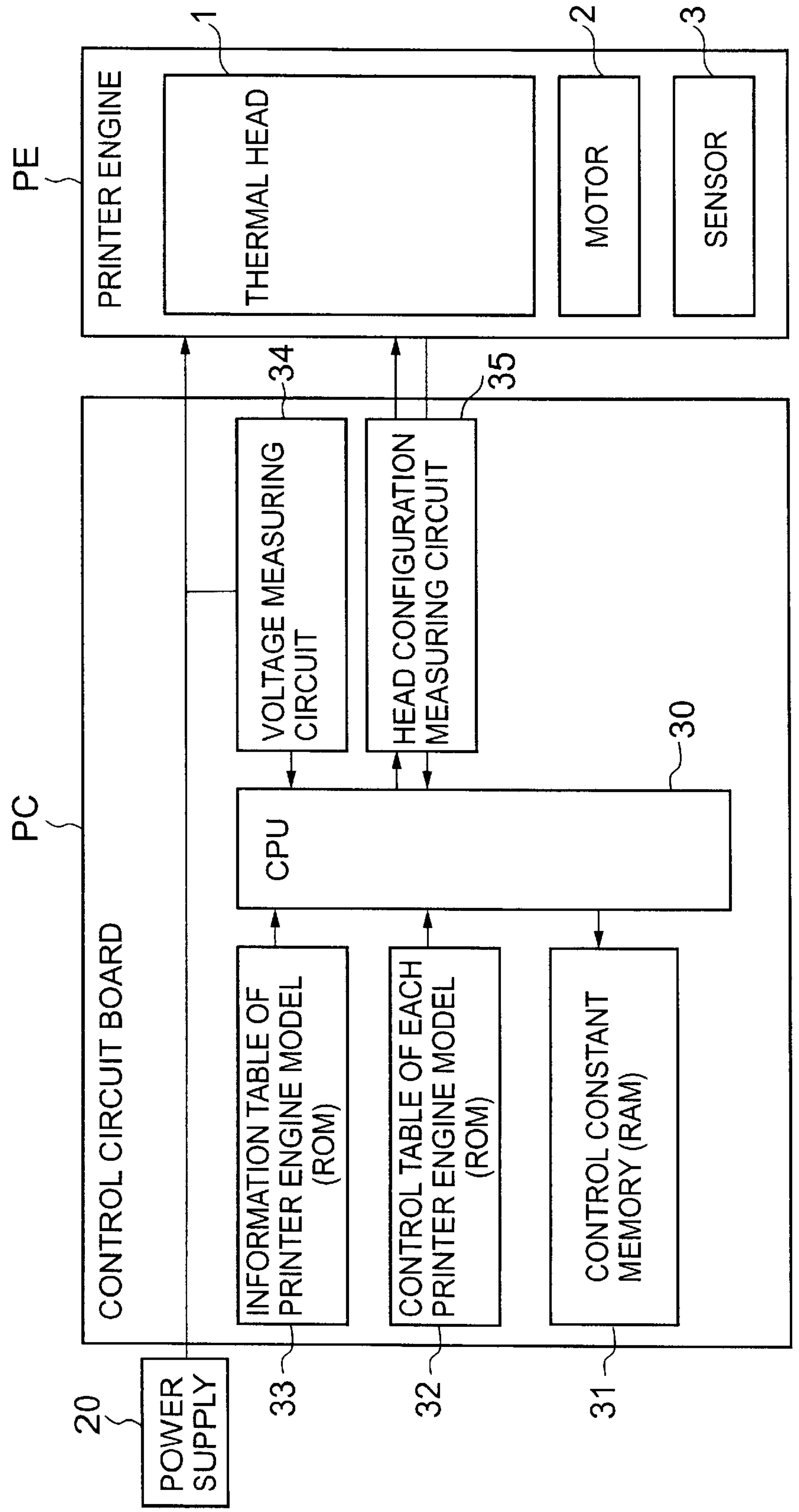
FIG. 1 is a block diagram showing the schematic configuration of a printer controller and a printer engine according to an embodiment of the present invention.

FIG. 1 is a block diagram showing the schematic configuration of a printer controller PC and a printer engine PE as a determining apparatus of a thermal head of a thermal printer.

The printer engine PE is comprised of a thermal head 1 composed of a heating resistor 1*a* and a resistor 1*b* or the like (FIG. 2), a motor 2 serving as a paper feeder, and a sensor 3 for detecting the position of the thermal head. There are various kinds of models of printer engines PE, wherein the respective models have respective properties such as the rated voltage of the thermal head, the number of dots of the thermal head and the number of driver ICs (that is, the number of blocks) for controlling the current-carrying through the heating resistor of the thermal head.

The printer controller PC is provided with various functions such as the function of communicating with a host computer issuing a printing instruction to a printer. However, the description of the functions not relating directly to the present invention or the description of the specific controls for performing the printing process will be omitted for simplification.

The printer controller PC is composed of: a CPU 30 for performing a control of the printer engine PE on the whole; a RAM 31 for storing various control constants; a ROM 32 for storing control tables dedicated to each of various models of the printer engine PE; and a ROM 33 for storing a model information table relating to each property consisting in various models of the printer engine PE. That is, the ROM 33 stores data of each of the models of the thermal head in tabular form such as the rated voltage of the thermal head, the resistance of each of the heating resistors, the number of dots and the number of blocks.

Furthermore, the printer controller PC includes: a voltage measuring circuit 34 for carrying out a measurement of a power supply voltage which is supplied to the printer controller PC and the printer engine PE by an external supply device 20; and a head configuration measuring circuit 35 for carrying out a measurement of the configuration of the thermal head 1 of the printer engine PE.

Note that, the printer engine PE is detachably connected with the printer controller PC via a predetermined connector.

Here, the examples of the specific structure and the action relating to the voltage measuring circuit 34 and the head configuration measuring circuit 35 are described with reference to the block diagram shown in FIG. 2.

First, the voltage measuring circuit 34 is comprised of: a switch transistor TR1 for a printing power supply; resistors R4, R5 for generating base bias voltage; and fixed resistors R1, R2 for dividing a printing power supply voltage, which are connected in series between the emitter of the transistor TR1 and a grounding point. The base of the transistor TR1 is connected with an output terminal for switch 30*a* of the CPU 30 via an end of the resistor R5, and the connected node disposed between the fixed resistor R1 and the fixed resistor R2 is connected with an analog input terminal for voltage measurement 30*b* of the CPU 30. The emitter terminal of the transistor TR1 is connected with the thermal head 1 to supply the head driving power supply.

Further, from the CPU 30, the thermal head 1 receives respective ones of strobing signals STB 1 to 6 as printing control signal, a serial clock signal SCLK and a serial data signal SDATA for serially transferring printing data to the thermal head, and a latch signal LATCH for latching the data input to the thermal head into the internal resistor 1*b*.

At the first step of the voltage measurement performed by this voltage measuring circuit 34, the strobing signals STB 1 to 6 output by the CPU 30 is negated in a low level. Next, the printing power supply switch signal output from the output terminal for switch 30*a* of the CPU 30 is switched to low to carry currents through the resistors R4, R5 to turn on the transistor TR1. Therefore, a printing power supply 20A applies a voltage to the thermal head 1. The CPU 30 measures the voltage appeared in the analog input terminal for voltage measurement 30*b* in order to measure the voltage applied to the thermal head 1. In this case, since the voltage of the printing power supply 20A is divided by the fixed resistors R1, R2 of a predetermined ratio of resistance, when the voltage to be input into the analog input terminal for voltage measurement 30*b* is measured, the voltage of the printing power supply 20A can be obtained. The voltage measured by the above-described procedure is compared with the rated voltage of the thermal head consisting the thermal head property data stored in the above-described ROM 33, thereby making it as one standard for the model determination of the printer engine PE.

Next, the constitution of the head configuration measuring circuit 35 will be described. The head configuration measuring circuit 35 is composed of: a switch transistor TR2 for the circuit power supply; resistors R6, R7; a resistor for detection of thermal head resistance R3 which is connected with the emitter of the transistor TR2; and diodes D1, D2 for preventing backflow. The base of the transistor TR2 is connected with an output terminal for head measuring switch 30*c* of the CPU 30 via the resistor R7, and the connected node disposed between a cathode terminal of the diode D1 and an anode terminal of the diode D2 is connected with an analog input terminal for head resistance measurement 30*d* of the CPU 30.

Hereinbelow, the procedure for measuring the configuration of the thermal head 1 with use of this head configuration measuring circuit 35, will be described. Note that, when this head configuration measuring circuit 35 carries out the measurement, the switch transistor TR1 of the printing power supply 20A is turned off. At the first step in the head configuration measurement, the CPU 30 writes 128-byte "0" to the thermal head 1 by serial communication (that is, all the dots of the thermal head 1 are switched to off). Next, the CPU 30 writes "1" for 1-bit of the resistor for latching the printing data to the thermal head 1 by the serial communication (that is, only the initial 1-dot of the thermal head 1 is switched to on.) Next, the output terminal for head measuring switch 30*c* of the CPU 30 is switched in a low level to carry currents through the resistors R6, R7, and the switch transistor TR2 for the circuit power supply is turned on. Next, the CPU 30 outputs the latch signal (LATCH), and the strobing signal STB corresponding to the heating resistor to be measured is switched to on (first, the STB 1 is switched to on.) At this time, the CPU 30 measures the voltage appeared in the analog input terminal for head resistance measurement 30*d*. In this case, since the voltage of the circuit power supply 20B supplied to the thermal head 1 via the transistor TR2 is divided by the resistance detecting resistor R3 and the heating resistor of the thermal head 1 at a predetermined constant, when the voltage input into the analog input terminal for head resistance measurement 30*d* is measured, the resistance of the heating resistor of the thermal head 1 can be obtained.

Furthermore, when the data "1" of the resistor 1*b* is shifted by one bit to sequentially check each dot of the thermal head 1, the information such as the dot position of open-abnormality, the total number of dots or the total number of blocks of the thermal head 1, the average resistance, the number of dots of each of the blocks and the like, can be obtained.

Accordingly, when the information such as the resistance, the total number of dots, the total number of blocks, the average resistance of the heating resistor 1*a* of the thermal head 1, the number of dots of each of the blocks and the like, which are obtained by the above-described procedure, is compared/checked with the property data of the thermal head stored in the above-described ROM 33, the printer controller can decide the model of the printer engine PE.

Note that, for example, when the thermal head 1 is connected with the printer controller PC and thereafter the printer controller performs the initialization of the printer just after the main switch of the thermal printer is turned on, simultaneously with the printer controller can carry out a voltage measurement by using the voltage measuring circuit 34 and acquire the property data of the thermal head by using the head configuration measuring circuit 35. Therefore, on start-up of the system, the printer controller PC can perform such a determination of the printer engine PE model as the essential action for executing normal printing. Thereafter, when the printer controller PC selects the appropriate control table from the ROM 32 and completes the table setting, the printer controller PC can perform the accurate control afterward.

Next, the procedure of a thermal head determination process (head initial diagnostic process), which is performed by the printer controller PC at the time of initializing the above-described printer, is described with reference to the flowchart shown in FIG. 3.

When activating this process, at a first step S1, the voltage measuring circuit 34 measures the applied voltage of the thermal head 1 by the above-described procedure, and the process advances to step S2. At step S2, the head configuration measuring circuit 35 measures the configuration of the thermal head 1 by the above-described procedure, and the process advances to step S3. At step S3, the printer controller PC reads the model information from the model information table stored in the ROM 33 and loads the information into the RAM 31, and the process advances to step S4.

At step S4, the printer controller PC compares/checks the applied voltage measured at step S1 and the configuration of the thermal head 1 measured at step S2 with the model information loaded into the RAM 31 at step S3. When it is determined that they do not match, the process advances to step S5 to determine whether all of the model information has been compared with. In case of NO at step S4, the process returns to step S3 to repeat the above-described process. In case of YES at step S4, the printer controller PC determines that there is no model to be matched and performs an error process (display of an error, output of a notifying beep and the like).

On the other hand, when it is determined that any of the thermal head model information and the applied voltage and the head configuration matches at the step S4, the process advances to step S6 to read the control table of the model to be set from the ROM 32. When the printer controller PC stores the control table into the predetermined area of the RAM 31 at step S7, the head initial diagnostic process is completed.

Accordingly, by simply connecting the printer engine PE with the printer controller PC, the printer controller PC can determine automatically the correct model of the thermal head. Since the printer controller PC can specify the control table suitable for the thermal head based on the result of the determination, it can effectively prevent such occurrences of a breakage or a mis-action of the printer engine PE by the mis-setting of the thermal head model by a DIP switch or the like.

Furthermore, since the printer controller PC does not need to have the conventional model setting switch (DIP switch or the like), it can prevent the human mistake in setting the model of the thermal head. The reliability of the apparatus is improved, and the number of components can be reduced, resulting in a reduction in the cost of the thermal printer.

Although the invention achieved by the inventor of the present invention has been described specifically based on the embodiment, it is obvious that the present invention is not intended to be limited to the above-described embodiment, and various changes may be made therein without departing from the spirit of the present invention.

According to the present invention, the apparatus for determining the property of the thermal head including a plurality of heating devices is provided by comprising: the thermal head property storing device for previously storing the property data of the plurality of various kinds of thermal heads; the thermal head property measuring devices for measuring the property of the thermal head to be connected; and the thermal head determining devices for determining the thermal head when comparing/checking the property measured by the thermal head property measuring devices with the data stored in the thermal head property storing device. Therefore, the present invention includes such an effect that, by simply connecting the thermal head with the printer controller PC, the printer controller PC can determine automatically the correct model of the thermal head, and since the printer controller PC can specify the control table suitable for the thermal head based on the result of the determination, for example, it can prevent the situation where a breakage or a mis-action of the thermal head occurs due to the mis-setting of the thermal head model.

Furthermore, the present invention includes another effect that, since the printer controller PC does not need to have the model setting switch, it can prevent the human mistake in setting the model of the thermal head and it can reduce the number of components, resulting in a reduction in the cost of the thermal printer.

What is claimed is:

1. A thermal head model type determining apparatus for determining a model type of a thermal head having a plurality of heating devices, comprising:

thermal head property storing means for storing property data of a plurality of different model types of thermal heads;

thermal head property measuring means for measuring properties of a thermal head connected to the thermal head model type determining apparatus; and thermal head model type identifying means for identifying the model type of the thermal head connected to the thermal head model type determining apparatus by comparing the properties measured by the thermal head property measuring means with the data stored in the thermal head property storing means.

2. A thermal head model type determining apparatus according to claim 1; wherein the property data of each thermal head model type stored in the thermal head property storing means includes a rated voltage of the thermal head, a resistance of each of the heating devices of the thermal head, and a number of dots of the thermal head.

3. A thermal head model type determining apparatus according to claim 1; wherein the thermal head property measuring means comprises applied voltage measuring means for measuring a voltage applied to the thermal head connected to the thermal head model type determining apparatus.

4. A thermal head model type determining apparatus according to claim 1; wherein the thermal head property measuring means comprises thermal head configuration measuring means for measuring a number of dots of the thermal head and a resistance of each of the heating devices of the thermal head connected to the thermal head model type determining apparatus.

5. A thermal head model type determining apparatus according to claim 1; wherein the thermal head property storing means and the thermal head property measuring means are provided in a controlling apparatus for controlling the thermal head.

6. A thermal head model type determining method for determining a model type of a thermal head having a plurality of heating devices, comprising the steps of:

storing property data of a plurality of different model types of thermal heads;

measuring properties of a respective thermal head after connection of the respective thermal head to a printer controller;

comparing a result of the measurement with the stored property data of the plurality of different model types of thermal heads; and determining the model type of the respective thermal head based on the comparison result.

7. A thermal head model type determining method according to claim 6; wherein the property data of each thermal head model type stored in the storing step includes a rated voltage of the thermal head, and a number of dots of the thermal head.

8. A thermal head model type determining method according to claim 6; wherein the step of measuring the properties of a respective thermal head comprises the step of measuring a voltage applied to the thermal head connected to the printer controller.

9. A thermal head model type determining method according to claim 6; wherein the step of measuring the properties of a respective thermal head comprises the step of measuring a resistance and a number of dots of each of the heating devices of the thermal head connected to the printer controller.

10. A thermal head model type determining apparatus for a thermal printer having a print engine containing a replaceable thermal head and a printer controller for controlling the print engine, the thermal head model type determining apparatus comprising: a memory for storing model type information tables containing property data for each of a plurality of different thermal head model types; a measuring circuit for measuring properties of a thermal head provided in the print engine; and thermal head model type identifying means for determining the model type of the thermal head provided in the print engine by comparing the properties measured by the measuring circuit with the model type information tables stored in the memory.

11. A thermal head model type determining apparatus according to claim 10; wherein the memory further stores control tables used by the printer controller for controlling a plurality of different thermal head model types; and the printer controller selects a control table based on a thermal head identified by the thermal head model type identifying means.

12. A thermal head model type determining apparatus according to claim 10; wherein the thermal head model type identifying means comprises a program executed by the printer controller.

13. A thermal head model type determining apparatus according to claim 10; wherein the measuring circuit comprises a voltage measuring circuit for measuring a voltage of a power source voltage supplied to the printer controller and the print engine.

14. A thermal head model type determining apparatus according to claim 10; wherein the measuring circuit comprises a thermal head configuration measuring circuit for measuring a configuration of a thermal head provided in the print engine. controller.

15. A thermal head model type determining apparatus according to claim 14; wherein the thermal head configuration measuring circuit measures at least one of a rated voltage of the thermal head, a number of dots of the thermal head, a resistance of heating elements of the thermal head, and a number of blocks of the thermal head.

16. A thermal head model type determining apparatus according to claim 15; wherein the property data of each different thermal head model type comprises at least one of a rated voltage of the thermal head, a number of dots of the thermal head, a resistance of heating elements of the thermal head, and a number of blocks of the thermal head.

17. A thermal head model type determining apparatus according to claim 10; wherein the property data of each different thermal head model type comprises at least one of a rated voltage of the thermal head, a number of dots of the thermal head, a resistance of heating elements of the thermal head, and a number of blocks of the thermal head.

18. A thermal head model type determining apparatus according to claim 10; wherein the print engine comprises a thermal head, a motor for feeding a printing paper, and a sensor for detecting the position of the thermal head.

* * * * *